(12) United States Patent
Wang et al.

(10) Patent No.: US 11,437,385 B2
(45) Date of Patent: Sep. 6, 2022

(54) FINFET SRAM CELLS WITH REDUCED FIN PITCH

(71) Applicant: Taiwan Semiconductor Manufacturing Co., Ltd., Hsin-Chu (TW)

(72) Inventors: Chih-Hao Wang, Hsinchu County (TW); Yi-Hsun Chiu, Hsinchu County (TW); Yi-Hsiung Lin, Hsinchu County (TW); Shang-Wen Chang, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 255 days.

(21) Appl. No.: 16/526,415

(22) Filed: Jul. 30, 2019

(65) Prior Publication Data

US 2020/0098764 A1 Mar. 26, 2020

Related U.S. Application Data

(60) Provisional application No. 62/735,483, filed on Sep. 24, 2018.

(51) Int. Cl.
*H01L 27/11* (2006.01)
*H01L 27/088* (2006.01)
(Continued)

(52) U.S. Cl.
CPC ........ *H01L 27/1104* (2013.01); *H01L 21/762* (2013.01); *H01L 27/0886* (2013.01);
(Continued)

(58) Field of Classification Search
CPC ......... H01L 29/41791; H01L 29/42356; H01L 29/785; H01L 29/66795; H01L 27/0886; H01L 27/1104
See application file for complete search history.

(56) References Cited

U.S. PATENT DOCUMENTS 6,977,837 B2   12/2005   Watanabe et al.
7,812,373 B2   10/2010   Bauer et al.
(Continued)

OTHER PUBLICATIONS

Yasuhiro Fukaura et al., "A Highly Manufacturable High Density Embedded SRAM Technology for 90nm CMOS", 2002, pp. 415-418, International Electron Devices Meeting, San Francisco, CA, USA.

*Primary Examiner* — Sue A Purvis
*Assistant Examiner* — Scott Stowe
(74) *Attorney, Agent, or Firm* — Haynes and Boone, LLP

(57) ABSTRACT

A static random access memory (SRAM) cell includes a first p-type semiconductor fin, a first dielectric fin, a first hybrid fin, a second hybrid fin, a second dielectric fin, and a second p-type semiconductor fin disposed in this order along a first direction and oriented lengthwise along a second direction, where each of the first and the second hybrid fins has a first portion including an n-type semiconductor material and a second portion including a dielectric material. The SRAM cell further includes n-type source/drain (S/D) epitaxial features disposed over each of the first and the second p-type semiconductor fins, p-type S/D epitaxial features disposed over the first portion of each of the first and the second hybrid fins, and S/D contacts physically contacting each of the p-type S/D epitaxial features and the second portion of each of the first and the second hybrid fins.

20 Claims, 5 Drawing Sheets

(51) Int. Cl.
   *H01L 29/417*   (2006.01)
   *H01L 21/762*   (2006.01)
   *H01L 29/423*   (2006.01)
   *G11C 11/412*   (2006.01)

(52) U.S. Cl.
   CPC .. *H01L 29/41791* (2013.01); *H01L 29/42356* (2013.01); *G11C 11/412* (2013.01)

(56) References Cited

U.S. PATENT DOCUMENTS

| | | |
|---|---|---|
| 8,621,398 B2 | 12/2013 | Shen et al. |
| 8,772,109 B2 | 7/2014 | Colinge |
| 8,779,528 B2 | 7/2014 | Liaw |
| 8,785,285 B2 | 7/2014 | Tsai et al. |
| 8,796,666 B1 | 8/2014 | Huang et al. |
| 8,815,712 B2 | 8/2014 | Wan et al. |
| 8,816,444 B2 | 8/2014 | Wann et al. |
| 8,823,065 B2 | 9/2014 | Wang et al. |
| 8,830,732 B2 | 9/2014 | Liaw |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,860,148 B2 | 10/2014 | Hu et al. |
| 8,962,400 B2 | 2/2015 | Tsai et al. |
| 8,963,258 B2 | 2/2015 | Yu et al. |
| 8,964,453 B2 | 2/2015 | Lin et al. |
| 8,964,457 B2 | 2/2015 | Liaw |
| 9,093,514 B2 | 7/2015 | Tsai et al. |
| 9,093,530 B2 | 7/2015 | Huang et al. |
| 9,105,490 B2 | 8/2015 | Wang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,236,300 B2 | 1/2016 | Liaw |
| 9,245,805 B2 | 1/2016 | Yeh et al. |
| 9,520,482 B1 | 12/2016 | Chang et al. |
| 9,548,303 B2 | 1/2017 | Lee et al. |
| 9,576,814 B2 | 2/2017 | Wu et al. |
| 2009/0017628 A1 | 1/2009 | Kim et al. |
| 2013/0094035 A1 | 4/2013 | Chang et al. |
| 2013/0285116 A1 | 10/2013 | Lochtefeld et al. |
| 2020/0083222 A1* | 3/2020 | Kim .................. H01L 29/66545 |

* cited by examiner

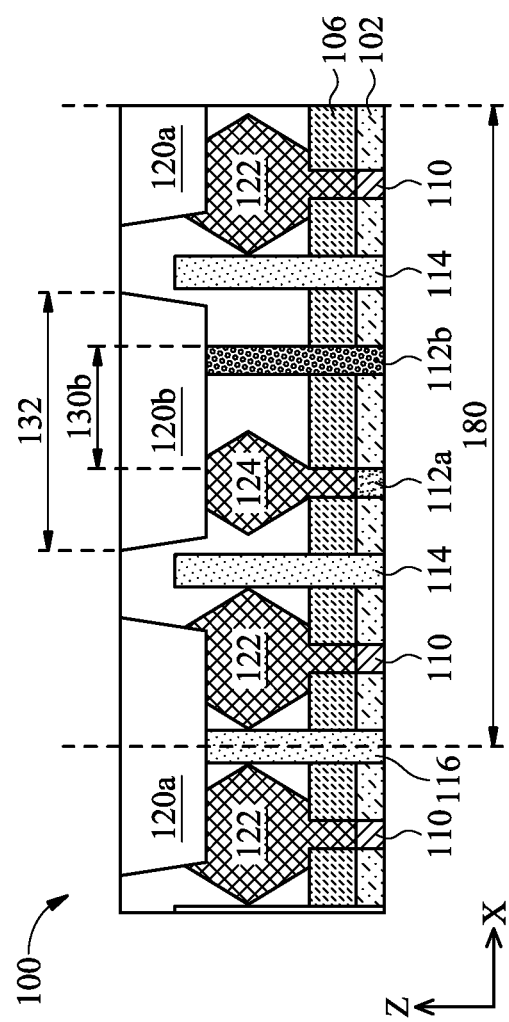
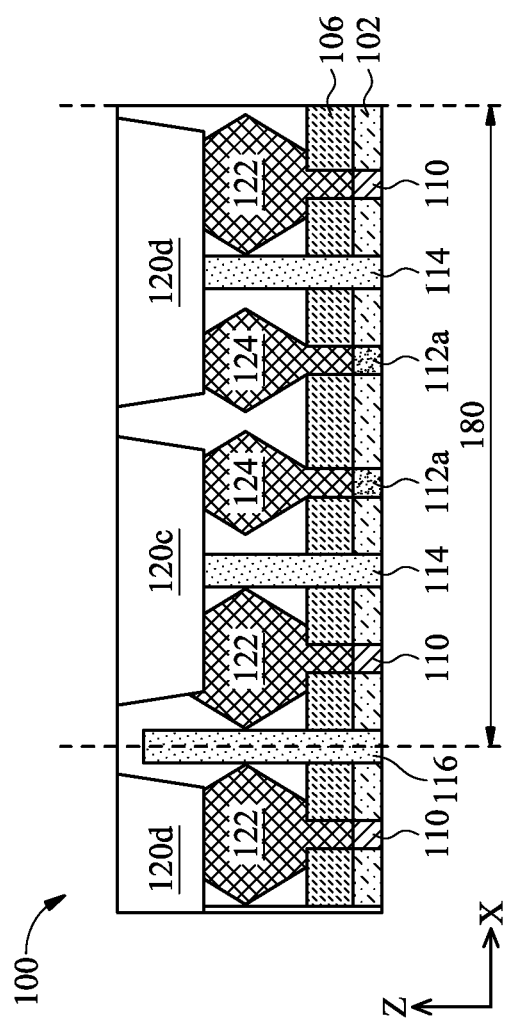
FIG. 4A
FIG. 4B

FINFET SRAM CELLS WITH REDUCED FIN PITCH

CROSS-REFERENCE TO RELATED APPLICATIONS

This is a non-provisional application of and claims priority to U.S. Provisional Patent Application Ser. No. 62/735,483, filed on Sep. 24, 2018, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, in fin-like field effect transistor (FinFET) fabrication processes, it has become challenging to meet the demand for increased fin density and decreased cell dimension while providing high circuit performance in devices such as static random access memory (SRAM) cells. In many instances, reduction in cell dimension may lead to a host of issues that adversely impact many aspects of the device performance. Accordingly, improvements in these areas of FinFET fabrication are desirable.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 4A and 4B are cross-sectional views of the portion of the semiconductor device of FIG. 3 along dashed line A-A' and dashed line B-B' of FIG. 3, respectively, according to some embodiments of the present disclosure.

DETAILED DESCRIPTION

Figure 1:
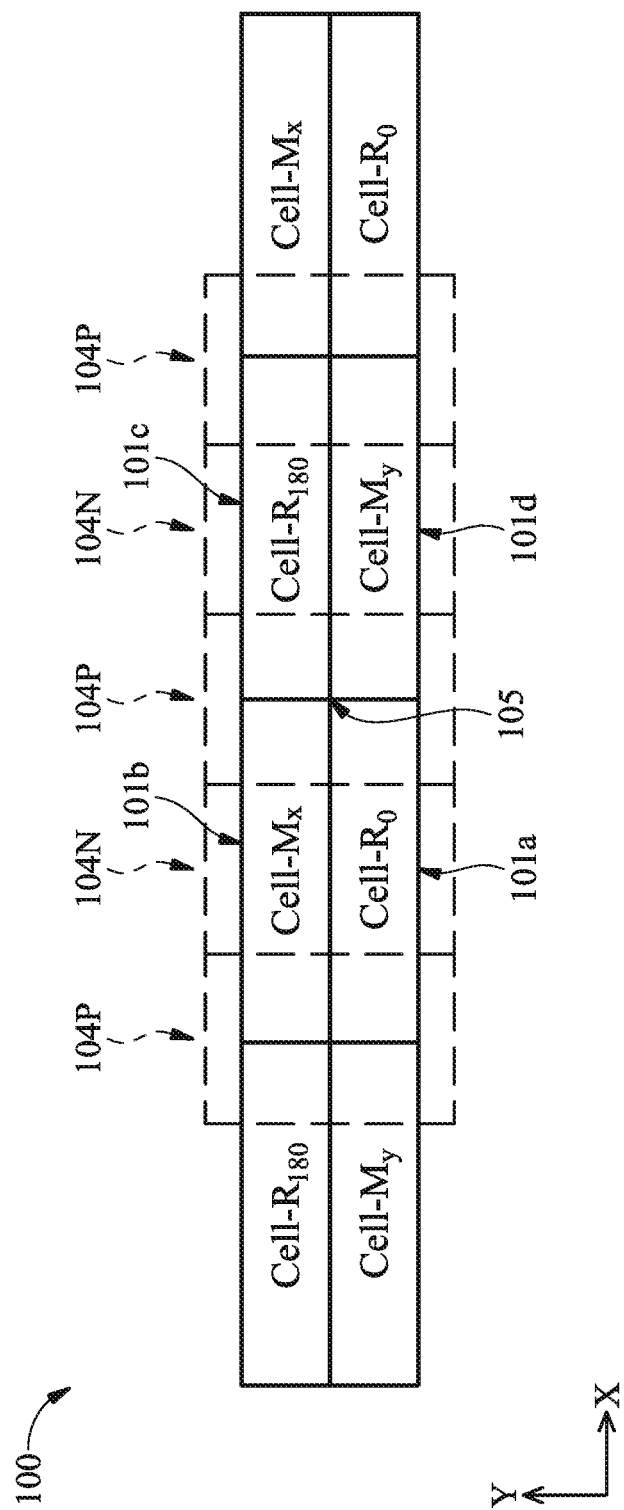
FIG. 1 is a schematic illustration of a layout of a semiconductor device, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and methods of forming the same. More particularly, the present disclosure is related to SRAM cells including FinFETs.

As the demand for increased device density continues to grow, many challenges are present in meeting such demand while maintaining desired device performance. For example, higher device density and integration means that more FinFETs (hence, more fins) are present per unit wafer area. This leads to narrow fin-to-fin spacing (i.e., fin pitch) between adjacent FinFETs, limiting the processing window of various devices, such as SRAM cells. Narrowed processing window may result in, for example, damages to the fins during a cut metal gate process, bridging of epitaxial source/drain (S/D) features, and/or loss of epitaxial S/D features when forming S/D contacts. While forming dielectric fins between semiconductor fins may enlarge the processing window when fabricating SRAM cells, it also increases dimensions of the cells by increasing fin pitch. The present disclosure provides FinFET SRAM cells, and methods of forming the same, that include dielectric fins (alternatively referred to as dummy fins) disposed between adjacent semiconductor fins, such that the fin pitch within each SRAM cell may be reduced without excessive reduction of the overall processing window.

In the accompanying figures, the device (or structure) 100 is provided for illustration purposes only and does not necessarily limit the embodiments of the present disclosure to any number of transistors, any number of regions, or any configuration of structures or regions. Furthermore, the device 100 may be an IC or a portion thereof, and may comprise static random access memory (SRAM) and/or standard logic circuits, passive components such as resistors, capacitors, and inductors, and active components such as p-type field effect transistors (PFETs), n-type FETs (NFETs), multi-gate FETs such as FinFETs and gate all-around (GAA) FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof. In many embodiments as depicted herein, the device 100 includes at least a portion of an SRAM cell.

FIG. 1 is a schematic representation of a layout of the device 100 that includes multiple cells (or devices), such as cells 101a, 101b, 101c, and 101d, portions of which form active regions, or wells, such as active regions 104P and 104N, within the device 100 (or in a substrate thereof, such as substrate 102 in FIG. 4A or 4B). The active regions 104P are of p-conductivity type (e.g., doped with p-type dopants such as boron), and are suitable for forming NMOSFETs (e.g., n-type FinFETs). The active regions 104N are of n-conductivity type (e.g., doped with n-type dopants such as phosphorous or arsenic), and are suitable for forming PMOSFETs (e.g., p-type FinFETs). As will be discussed in detail below, each of the cells 101a, 101b, 101c, and 101d includes multiple semiconductor fins of p-conductivity type (e.g., in the 104P active regions) suitable for forming n-type FinFETs and multiple semiconductor fins of n-conductivity type (e.g., in the 104N active regions) suitable for forming p-type FinFETs to make up one or more CMOSFETs therein. In many embodiments, each of the cells 101a, 101b, 101c, and 101d is defined by a region oriented lengthwise in the X direction and widthwise in the Y direction. The structure of the cells 101a, 101b, 101c, and 101d are discussed in detail below with reference to FIG. 2.

Figure 2:
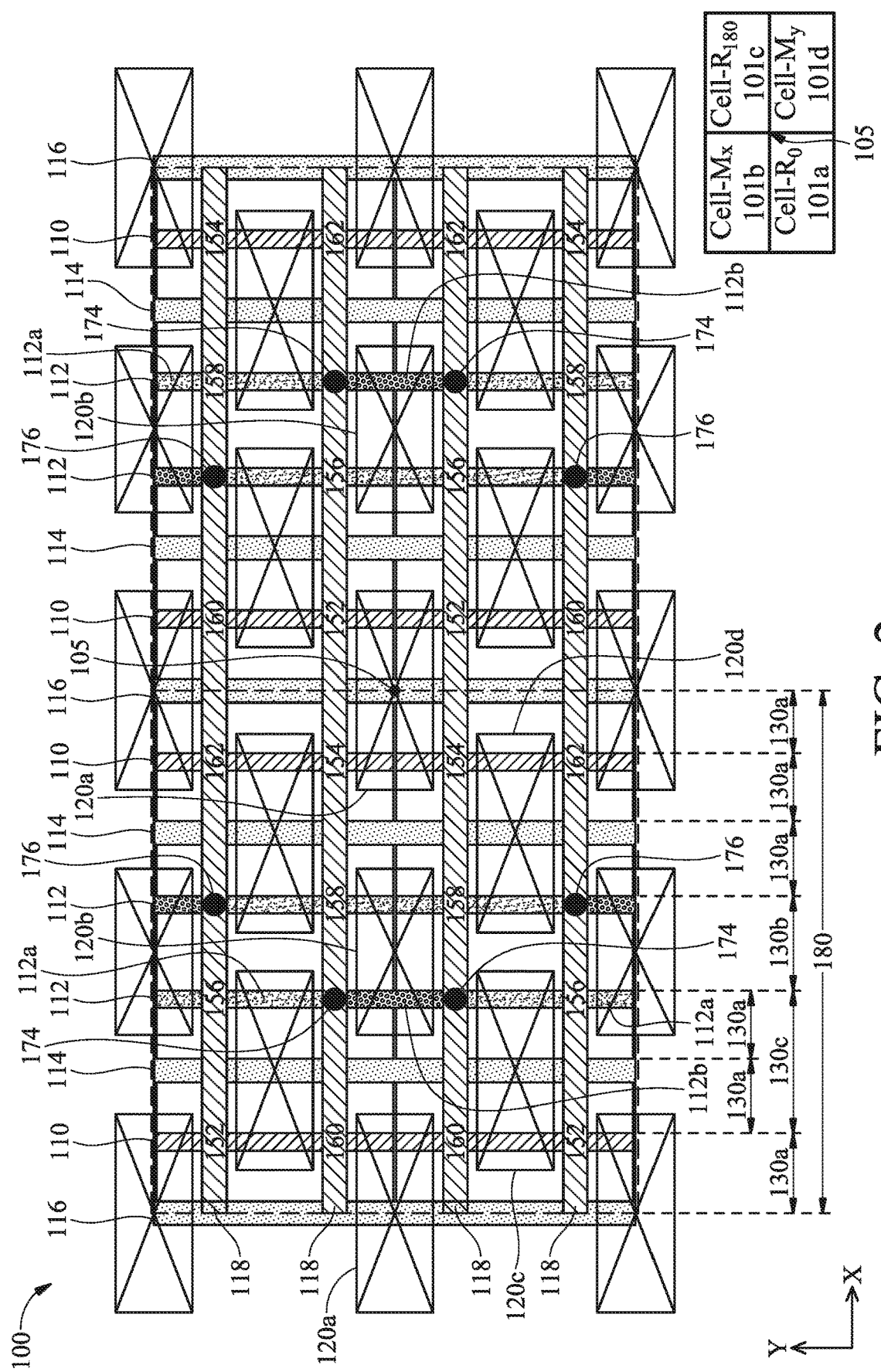
FIG. 2 is a top view of a portion of the semiconductor device of FIG. 1, according to some embodiments of the present disclosure.
Figure 3:
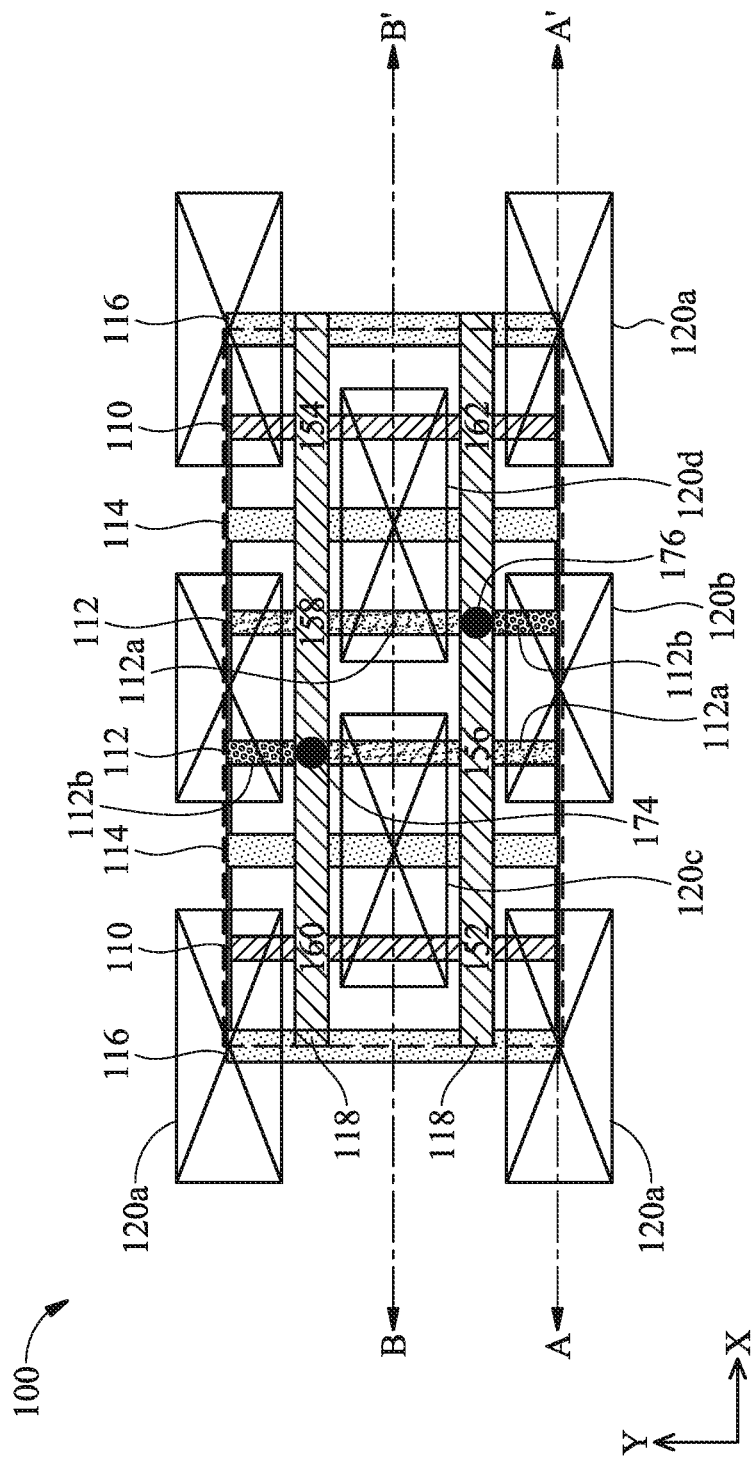
FIG. 3 is a top view of a portion of the semiconductor device of FIG. 2, according to some embodiments of the present disclosure.

FIG. 2 shows a top view of a portion of the device 100. FIG. 3 shows a portion (e.g., one of the cells 101a, 101b, 101c, or 101d) of the device 100. FIG. 4A is a cross-sectional view of the portion of the device 100 as shown in FIG. 3 taken along dashed line A-A', and FIG. 4B is a cross-sectional view of the portion of the device 100 as shown in FIG. 3 taken along dashed line B-B'. Referring to FIGS. 2-4B collectively, the device 100 includes a substrate 102 and the cells 101a, 101b, 101c, and 101d are formed over the substrate 102. As discussed above with reference to FIG. 1, the cells 101a, 101b, 101c, and 101d form multiple active regions 104P and 104N, configured to provide n-type FinFETs and p-type FinFETs, respectively.

Referring to FIG. 2, boundaries (or edges) of the cells 101a, 101b, 101c, and 101d along the Y direction are defined by dielectric fins 116. In other words, the dielectric fins 116 separate adjacent cells (e.g., cells 101b and 101c or cells 101a and 101d) from one another along the X direction. The dielectric fins 116 are oriented lengthwise along the Y direction and spaced from each other along the X direction. A distance between two adjacent dielectric fins 116 therefore defines a cell pitch 180 along the X direction for each of the cells 101a, 101b, 101c, and 101d.

The cells 101a, 101b, 101c, and 101d, which together define a two-by-two grid, exhibit mirror and/or rotational symmetry with respect to each other. For example, using the cell 101a as a reference (denoted "Cell-$R_0$" in FIGS. 1 and 2), a layout of the cell 101b (denoted "Cell-$M_x$") is a mirror image of a layout of the cell 101a with respect to the X direction. Similarly, a layout of the cell 101c is a mirror image of the layout of the cell 101b, and a layout of the cell 101d (denoted "Cell-$M_y$") is a mirror image of the layout of the cell 101a, both with respect to the Y direction. In other words, the layout of the cell 101c (denoted "Cell-$R_{180}$") is symmetric to the layout of the cell 101a by a rotation of 180 degrees about a geometric center 105 of the grid, which is defined as an intersection point of an imaginary line bisecting the rectangular grid along the Y direction and an imaginary line bisecting the rectangular grid along the X direction. As depicted in FIG. 2, the imaginary line bisecting the rectangular grid along the Y direction coincides with one of the dielectric fins 116 at the cell boundary.

Referring collectively to FIGS. 2-4B, the device 100 further includes multiple semiconductor fins 110 of p-conductivity type configured to form NMOS devices, multiple hybrid fins 112, and multiple dielectric fins 114 intermixed with the semiconductor fins 110 and the hybrid fin 112. A hybrid fin, as used in the present disclosure, refers to a fin structure that includes both a semiconductor portion and a dielectric portion that have about the same height and width and whose ends are laterally abutting each other to form a continuous and elongated structure. The semiconductor portion may be configured to form NMOSFET and/or PMOSFET, and the dielectric portion comprises one or more dielectric materials. The semiconductor fins 110, the hybrid fins 112, and the dielectric fins 114 are oriented lengthwise along the Y direction and are spaced from each other along the X direction. Each of the hybrid fins 112 includes a semiconductor portion 112a and a dielectric portion 112b disposed adjacent to each other along the Y direction. The semiconductor portion 112a of each hybrid fin 112 is of n-conductivity type configured to form PMOS devices, while the dielectric portion 112b is configured to accommodate subsequent processing steps as will be discussed in detail below. Stated in a different way, the hybrid fin 112 may be considered a semiconductor fin of n-conductivity type that includes a dielectric portion (112b) along a length of the fin. The dielectric fins 114 may be similar to the dielectric fins 116 in composition. In many embodiments, the dielectric portion 112b of each hybrid fin 112 includes a material the same as or different from a composition of the dielectric fins 114 and 116. In the depicted embodiment, the dielectric portion 112b includes a dielectric material the same as that of the dielectric fins 114 and 116.

Each of the dielectric fins 114 is disposed between a semiconductor fin 110 and a hybrid fin 112, and each of the dielectric fins 116 is disposed between two semiconductor fins 110. As such, the dielectric fins 114 and 116 are configured to increase the fin-to-fin spacing between adjacent semiconductor fin 110 and hybrid fin 112 and between adjacent semiconductor fins 110, respectively. In many embodiments, the semiconductor fins 110, the hybrid fins 112, and the dielectric fins 114 and 116 extend continuously along the Y direction across the cell boundaries along the Y direction; though the present disclosure is not limited to such configuration. In the depicted embodiment, each cell (e.g., 101a) includes two semiconductor fins 110 and two hybrid fins 112 intermixed with two dielectric fins 114, with the boundaries of the cell defined by the dielectric fins 116 along the Y direction.

In many embodiments, referring to FIG. 2, a spacing (also referred to as a fin pitch) 130b between two adjacent hybrid fins 112 is less than a spacing 130c between neighboring semiconductor fin 110 and hybrid fin 112, but more than a spacing (or a fin pitch) 130a, which is defined as the spacing between neighboring semiconductor fin 110 and dielectric fin 114, between neighboring semiconductor fin 110 and dielectric fin 116, or between neighboring hybrid fin 112 and dielectric fin 114. In many embodiments, the spacing 130c is approximately equal to twice the fin pitch 130a. In further embodiments, the fin pitch 130b is approximately equal to 1.5 times the fin pitch 130a. Stated in a different way, the cell pitch 180 may be described by 7.5 times the fin pitch 130a or alternatively, the fin pitch 130b is about 25% less than the spacing 130c. In comparison, the cell pitch 180 would have been 8 times the fin pitch 130a if another dielectric fin 114 was disposed between adjacent hybrid fins 112. Therefore, eliminating the dielectric fin between the hybrid fins 112 reduces the cell pitch 180 by 0.5 of a fin pitch 130a, thereby reducing a total area of each SRAM cell.

Generally, dielectric fins disposed between semiconductor fins serve to prevent possible merging of S/D epitaxial features, protect epitaxial S/D features from being damaged during formation of S/D contacts, and/or enlarge a landing area for S/D contacts for improved performance. As will be discussed below, by eliminating the dielectric fin between adjacent hybrid fins 112 and including a dielectric portion in the hybrid fins 112, not only would the shrinking of SRAM cell sizes be achievable, but damage to epitaxial S/D features would be minimized and the landing area for S/D contacts would not be compromised.

Referring to FIGS. 4A and 4B, the device 100 further includes an isolation structure 106 disposed over the substrate 102. The semiconductor fins 110, the hybrid fins 112, and the dielectric fins 114 and 116 are partially embedded in the isolation structure 106. Referring to FIGS. 2 and 3, the device 100 further includes gate structures 118 oriented lengthwise along the X direction and are spaced from each other along the Y direction. The gate structures 118 engage the semiconductor fins 110 and the semiconductor portions 112a of the hybrid fins 112 in each cell to form various FinFETs described in detail below. Furthermore, the gate structures 118 may engage one or more of the dielectric fins 114 and 116 disposed between the semiconductor fins 110 and the hybrid fins 112. The gate structures 118 are high-k metal gates in some embodiments. The device 100 may further include gate spacers (not depicted) disposed on sidewalls of the gate structures 118.

Collectively referring to FIGS. 3, 4A, and 4B, the device 100 further includes S/D epitaxial features 122 disposed over the semiconductor fins 110 and S/D epitaxial features 124 disposed over the semiconductor portions 112a of the hybrid fins 112. The S/D epitaxial features 122 and 124 are disposed on opposite sides of the respective gate structures 118 (i.e., in the S/D regions of the semiconductor fins 110 and the semiconductor portions 112a of the hybrid fins 112). FIG. 4A illustrates a cross-sectional view of the device 100 take along the dashed line A-A', i.e., through the S/D regions of the semiconductor fins 110, the semiconductor portion 112a of one hybrid fin 112, and the dielectric portion 112b of an adjacent hybrid fin 112 as depicted in FIG. 3. FIG. 4B illustrates a cross-sectional view of the device 100 take along the dashed line B-B', i.e., through the S/D regions of the semiconductor fins 110 and the semiconductor portions 112a of the hybrid fins 112. In the present embodiment, the S/D epitaxial features 122 and 124 are doped with n-type dopants and p-type dopants, respectively. Accordingly, the S/D epitaxial features 122 are referred to as n-type S/D epitaxial features and the S/D epitaxial features 124 are referred to as p-type S/D epitaxial features.

Referring to FIGS. 4A and 4B, neighboring n-type S/D epitaxial features 122 are separated by dielectric fins 116, while neighboring n-type and p-type S/D epitaxial features 122 and 124 are separated by dielectric fins 114. However, no dielectric fin is disposed between two adjacent p-type S/D epitaxial features 124. In comparison to the n-type S/D epitaxial features, such as the n-type S/D epitaxial features 122, p-type S/D epitaxial features, such as the p-type S/D epitaxial features 124, may be formed to relatively smaller sizes than n-type S/D epitaxial features, rendering the merging of adjacent epitaxial features less likely for p-type S/D epitaxial features than for n-type S/D epitaxial features. Accordingly, dielectric fins may be omitted between the p-type S/D epitaxial features 124 as depicted in FIG. 4B in an effort to reduce the overall cell pitch 180.

Still referring to FIGS. 3, 4A, and 4B collectively, the device 100 further includes multiple S/D contacts 120a, 120b, 120c, and 120d oriented lengthwise along the X direction and S/D contacts of the same designation are spaced from each other along the Y direction. Referring to FIG. 4A, each S/D contact 120a is disposed over and physically contacts two n-type S/D epitaxial features 122 and a dielectric fin 116 disposed therebetween. Each S/D contact 120b is disposed over and physically contacts a p-type S/D epitaxial feature 124 and a dielectric portion 112b of an adjacent hybrid fin 112. Referring to FIG. 4B, each S/D contact 120c is disposed over and physically contacts an n-type S/D epitaxial feature 122, a p-type S/D epitaxial feature 124, and a dielectric fin 114 disposed therebetween. Each S/D contact 120d is disposed over and physically contacts a p-type S/D epitaxial feature 124, an n-type S/D epitaxial feature 122, and a dielectric fin 114 disposed therebetween.

In many embodiments, the dielectric fins 114 and 116 as well as the dielectric portion 112b of the hybrid fins 112 serve as etch-stopping features for reducing damage to the S/D epitaxial features (such as the n-type S/D epitaxial features 122 and/or the p-type S/D epitaxial features) when forming of the S/D contacts 120a-120d. Because the p-type S/D epitaxial features 124 are generally formed to smaller sizes than their n-type counterparts, a length 132 of the S/D contact 120b is configured (e.g. by altering circuit layout design, etc.) to be greater than the spacing 130b between two adjacent hybrid fins 112 (i.e., the semiconductor portion 112a of one of the hybrid fins 112 and the dielectric portion 112b of the other hybrid fin 112 in FIG. 4A), such that the S/D contact 120b may land on the p-type S/D epitaxial feature 124 and the dielectric portion 112b of the hybrid fin 112, which acts as the etch-stopping feature as discussed above. Accordingly, by including the dielectric portion 112b in the hybrid fin 112 and lengthening the S/D contact 120b in the X direction to contact both the p-type S/D epitaxial feature 124 and the dielectric portion 112b, damage to the p-type S/D epitaxial feature 124 may be minimized during formation of the S/D contact 120b.

Due to the presence of the dielectric fins 114 and 116, the S/D epitaxial features 122 are given ample space to grow to a maximum or near-maximum volume for improved strain in the resulting FinFETs. Additionally, enlarged growth of the S/D epitaxial features provide increased landing area for the S/D contacts 120a, 120c, and 120d, thereby reducing the contact resistance of the device 100. However, if the dielectric fins 114 and 116 are absent, the S/D epitaxial features 122 could each only grow to a volume smaller than the maximum volume, compromising the performance of the device 100. Furthermore, if the dielectric portions 112b are absent from the hybrid fins 112 and/or if the length of the S/D contact 120b is not increased, the S/D contact 120b would only land on the p-type S/D epitaxial feature 124 without contacting any etch-stopping feature as discussed above, leading to potential damages to the p-type S/D epitaxial feature 124 when forming the S/D contact 120b.

Figure 5:
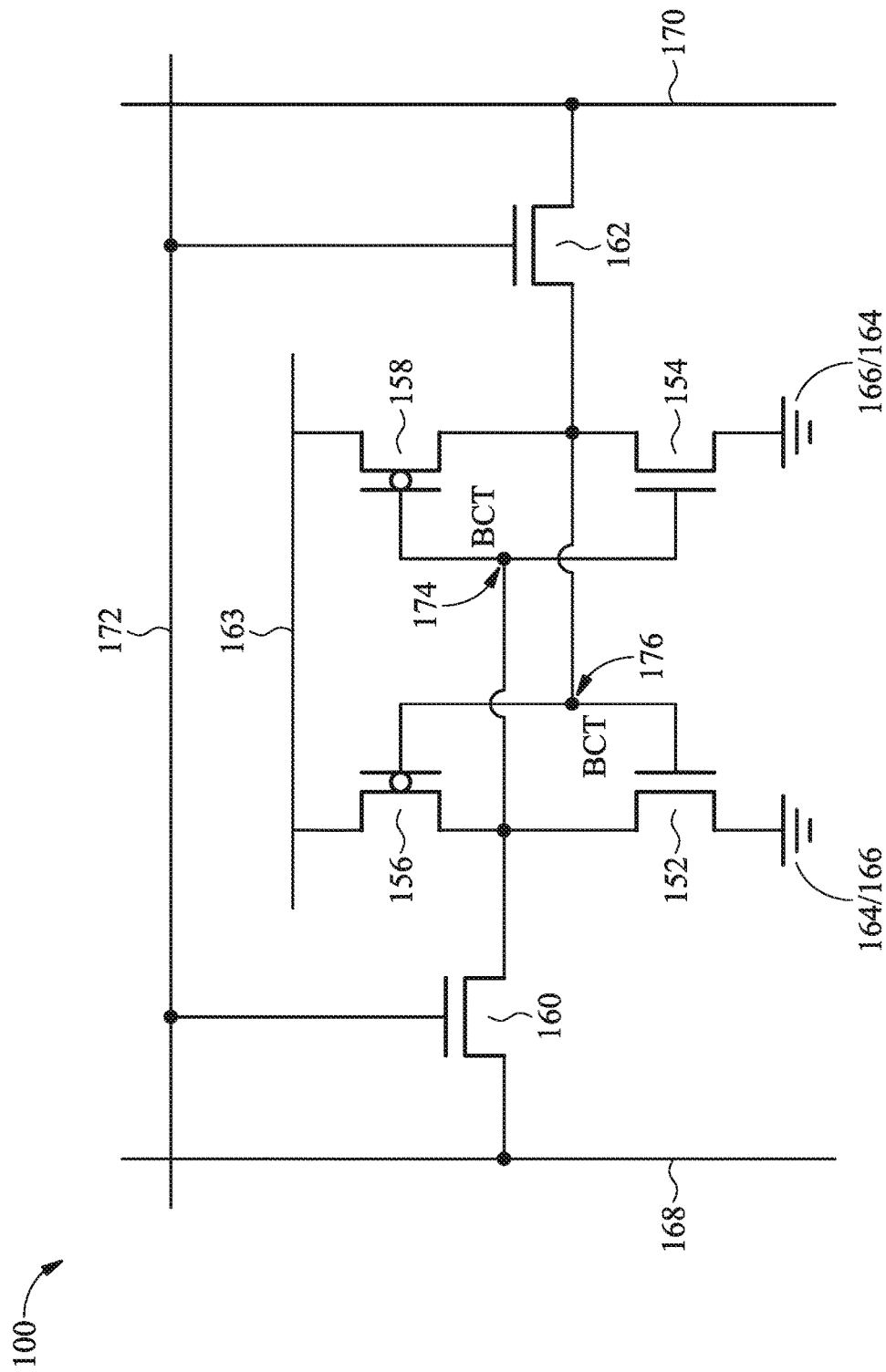
FIG. 5 is a schematic illustration of the portion of the semiconductor device of FIGS. 2-4B, according to some embodiments of the present disclosure.

Referring to FIGS. 2, 3, and 5, each cell (e.g., 101a) includes two pull-down (PD) FinFETs 152 and 154, two pull-up (PU) FinFET 156 and 158, and two pass-gate (PG) FinFETs 160 and 162. Adjacent PD, PU, and PG FinFETs along the X direction are separated by the dielectric fins 114. The PD FinFETs 152 and 154 and the PG FinFETs 160 and 162 are n-type FinFETs provided by portions of the gate structures 118 engaging the semiconductor fins 110 disposed in the active regions 104P. The PU FinFETs 156 and 158 are p-type FinFETs provided by portions of the gate structures 118 engaging the semiconductor portions 112a of the hybrid fins 112 disposed in the active regions 104N. In many embodiments, the PD FinFETs 152 and 154 and the PU FinFETs 156 and 158 are configured to provide two cross-coupled inverters as data storage device, while the PG FinFETs 160 and 162 are configured to provide control units for reading and writing the data. Referring to FIG. 5, each cell may further include CVdd line 163, CVss lines 164 and 166, bit line 168, bit-line bar 170, and word line 172. In the depicted embodiment, the device 100 includes single-fin FinFETs. In other words, each of the FinFETs includes either a single semiconductor fin 110 or a single hybrid fin 112. However, the present disclosure is not limited to such configuration.

Still referring to FIGS. 2, 3, and 5, each cell further includes two butted contacts (BCTs) 174 and 176 disposed over portions of the gate structures 118 that engage with the hybrid fins 112. In the present embodiment, each BCT 174 is disposed over the hybrid fin 112 that also forms the PU FET 156, and each BCT 176 is disposed over the hybrid fin 112 that also forms the PU FET 158. In many embodiments, the BCTs 174 and 176 are disposed over portions of a hybrid fin 112 that connect the semiconductor portion 112a with the dielectric portion 112b of that hybrid fin 112. In some embodiments, referring to FIG. 2, two adjacent BCTs 174 are disposed along the Y direction over the same hybrid fin 112 with the dielectric portion 112b disposed therebetween. Furthermore, the S/D contact 120b may be disposed over the dielectric portion 112b that is interposed between the two adjacent BCTs 174. In some embodiments, still referring to FIG. 2, two adjacent BCTs 176 are disposed along the Y direction over the same hybrid fin 112 with the semiconductor portion 112a disposed therebetween. Furthermore, the S/D contacts 120b and 120d may be disposed over the semiconductor portion 112a that is interposed between the two adjacent BCTs 176.

The device 100 may further include other components not shown in FIGS. 2-5, such as an etch stop layer over the S/D epitaxial features 122 and 124, pre-metallization dielectric (PMD) layer(s), interlayer dielectric (ILD) layers, vias and conductive lines, and metal lines for connecting various cells in the IC.

The various components of the device 100 are further described below. The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor-on-insulator (SOI) such as having a buried dielectric layer.

The semiconductor fins 110 and the semiconductor portions 112a of the hybrid fins 112 may include one or more semiconductor materials such as silicon, germanium, silicon carbon, or silicon germanium. Each semiconductor fin 110 includes a semiconductor material of p-conductivity type, such as silicon germanium doped with a p-type dopant such as boron, indium, and/or other p-type dopants. The semiconductor portion 112a of each hybrid fin 112 includes a semiconductor material of n-conductivity type, such as silicon, germanium, or silicon carbon doped with an n-type dopant such as arsenic, phosphorus, and/or other n-type dopant. In an embodiment, each of the semiconductor fins 110 and the semiconductor portions 112a of the hybrid fins 112 may include multiple different semiconductor layers stacked one over the other.

In many embodiments, the semiconductor fins 110 and the hybrid fins 112 may be fabricated together and subsequently doped with their respective dopant(s) as discussed above. The semiconductor fins 110 (of p-conductivity type) and the hybrid fins 112 (of n-conductivity type) may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the semiconductor fins 110 and the hybrid fins 112 by etching initial epitaxial semiconductor layers of the substrate 102. The etching process can include dry etching, wet etching, reactive ion etching (RIE), and/or other suitable processes. Subsequently, as will be discussed below, portions of each hybrid fin 112, which is of n-conductivity type, are replaced with a dielectric material to form the dielectric portions 112b, while the remaining portions of the hybrid fin 112 become the semiconductor portion 112a.

In one embodiment, forming the dielectric portions 112b of the hybrid fins 112 includes the following operations. First, trenches are formed in the hybrid fins 112 by a series of patterning and etching process(es) similar to those described above except that only the hybrid fins 112 are patterned (or cut) without substantially etching the semiconductor fins 110 or the isolation structure 106. Subsequently, one or more dielectric materials is deposited in the trenches to form the dielectric portions 112b of the hybrid fins 112, such that each dielectric portion 112b is interposed between two semiconductor portions 112a of the same hybrid fins 112 along the Y direction. In other words, sidewalls of the semiconductor portions 112a and sidewalls of the dielectric portions 112b of the same hybrid fin 112 are continuous along the Y direction. In some embodiments, the one or more dielectric materials may be deposited in the trenches at the same time as the forming of the dielectric fins 114 and 116, which is described in detail below. In many embodiments, the dielectric portions 112b of the hybrid fins 112 include the same dielectric material(s) as the dielectric fins 114 and/or 116. In alternative embodiments, the dielectric portions 112b of the hybrid fins 112 include dielectric materials different from those included in the dielectric fins 114 and/or 116.

The isolation structure 106 may include silicon oxide, silicon nitride, silicon oxynitride, fluoride-doped silicate glass (FSG), a low-k dielectric material, and/or other suitable insulating material. The isolation structure 106 may be shallow trench isolation (STI) features. In an embodiment, the isolation structure 106 is formed by etching trenches in the substrate 102, e.g., as part of the formation process for the semiconductor fins 110 and the hybrid fins 112. The trenches may then be filled with isolating material, followed by a chemical mechanical planarization (CMP) process and/or an etch-back process. In another embodiment, the isolation structure 106 is formed by depositing a dielectric material over the sidewalls of the semiconductor fins 110 and the hybrid fins 112 without fully filling the trenches between the semiconductor fins 110 and the hybrid fins 112. In other words, the isolation structure 106 is formed as a fin sidewall spacer. Other isolation structure such as field oxide, local oxidation of silicon (LOCOS), and/or other suitable structures are possible. The isolation structure 106 may include a multi-layer structure, for example, having one or more thermal oxide liner layers.

In the present embodiment, each dielectric fin 114 is disposed between a semiconductor fin 110 and a hybrid fin 112, while each dielectric fin 116 is disposed between two semiconductor fins 110. In some embodiments, the dielectric fins 116 define boundaries of each SRAM cell along the Y direction. Notably, no dielectric fin is disposed between two hybrid fins 112. As such, the separation distance (i.e., the fin pitch or spacing) 130b between two adjacent hybrid fins 112 is less than the spacing 130c between two adjacent semiconductor fins 110 but greater than the fin pitch 130a between adjacent semiconductor fin 110 and dielectric fin 114/116. In many embodiments, the dielectric fins 114 and 116 enlarge a separation distance between neighboring fins, offering benefits such as preventing merging of adjacent S/D epitaxial features and increasing a landing area for an S/D contact feature over the S/D epitaxial features. Where the dielectric fins are absent, the cell pitch 180 may be reduced, thereby reducing cell sizes and increasing device density.

Each of the dielectric fins 114 and 116 may include a single dielectric material or multiple dielectric materials (in, for example, a multi-layer structure). For example, the dielectric fins 114 and 116 may each include silicon oxide (e.g., $SiO_2$), silicon oxycarbide (e.g., SiOC), silicon oxycarbide nitride (SiOCN), silicon oxide with carbon contents, silicon oxide with nitrogen contents, a nitride-based dielectric, a metal oxide-based dielectric, hafnium oxide ($HfO_2$), tantalum oxide ($Ta_2O_5$), titanium oxide ($TiO_2$), zirconium oxide ($ZrO_2$), aluminum oxide ($Al_2O_3$), yttrium oxide ($Y_2O_3$), other suitable dielectric materials, or a combination thereof. The dielectric fins 114 and 116 may include similar dielectric material(s) or, alternatively, different dielectric materials. In some embodiments, the dielectric fins 114 and 116 are fabricated together as discussed below, include the same dielectric material(s), and only differ in terms of their locations with respect to the semiconductor fins 110 and the hybrid fins 112.

In one embodiment, forming the dielectric fins 114 and 116 includes the following operations. First, the isolation structure 106 is deposited as a spacer layer over the sidewalls of the semiconductor fins 110 and the hybrid fins 112 after the fins are first formed as discussed above. Before the isolation structure 106 is recessed to be lower than the semiconductor fins 110 and the hybrid fins 112, trenches are formed in the isolation structure 106 by a series of patterning and etching process(es). In one embodiment, the patterning and etching process(es) include forming a patterned resist layer (not depicted) over the semiconductor fins 110, the hybrid fins 112, and the isolation structure 106 to expose portions of the isolation structure 106 to be removed, and subsequently performing one or more etching processes to remove the exposed portions of the isolation structure 106 to form the trenches. The etching process may be a dry etching process, a wet etching process, a reactive ion etching (RIE) process, or combinations thereof. Thereafter, dielectric material(s) are deposited in the trenches to form the dielectric fins 114 and 116. The dielectric material(s) may be deposited using chemical vapor deposition (CVD), physical vapor deposition (PVD), atomic layer deposition (ALD), flowable CVD (FCVD), or other suitable methods. The isolation structure 106 is then planarized (e.g., by one or more CMP processes) to expose a top surface of each of the semiconductor fins 110 and the hybrid fins 112 and a top surface of each of the dielectric fins 114 and 116. Thereafter, the isolation structure 106 is recessed (e.g., by a chemical etching process) to be lower than the top surface of each of the semiconductor fins 110, the hybrid fins 112, and the dielectric fins 114 and 116.

The gate structures 118 include a gate dielectric layer (not depicted) and a gate electrode layer (not depicted). The gate dielectric layer may include silicon oxide ($SiO_2$), silicon oxynitride (SiON), aluminum silicon oxide (AlSiO), a high-k dielectric material such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof. The gate dielectric layer may be deposited by chemical oxidation, thermal oxidation, atomic layer deposition (ALD), or other suitable methods. The gate electrode layer may include a work function metal layer, a metal fill layer, and other suitable layers such as barrier layer(s) and capping layer(s). The work function metal layer may be a p-type or an n-type work function layer for the p-type FinFETs and n-type FinFETs, respectively. The p-type work function layer comprises a material such as titanium nitride (TiN), tantalum nitride (TaN), ruthenium (Ru), molybdenum (Mo), tungsten (W), platinum (Pt), other suitable materials, or combinations thereof. The n-type work function layer comprises a material such as titanium (Ti), aluminum (Al), tantalum carbide (TaC), tantalum carbide nitride (TaCN), tantalum silicon nitride (TaSiN), other suitable materials, or combinations thereof. The work function metal layer may include a plurality of layers and may be deposited by CVD, ALD, PVD, other suitable processes, or combinations thereof. The metal fill layer may include aluminum (Al), tungsten (W), cobalt (Co), copper (Cu), other suitable materials, or combinations thereof. The metal fill layer may be formed by CVD, PVD, ALD, plating, other suitable processes, or combinations thereof.

The device 100 may each further include gate spacer (not depicted) disposed along sidewalls of each gate structure 118. The gate spacer may include one or more dielectric layers having silicon nitride ($Si_3N_4$), silicon oxide ($SiO_2$), silicon carbide (SiC), silicon carbide nitride (SiCN), silicon oxynitride (SiON), silicon oxycarbide (SiOC), silicon oxycarbide nitride (SiOCN), a low-k dielectric material, other materials, or a combination thereof. The gate spacer may be formed by one or more methods including chemical oxidation, thermal oxidation, ALD, CVD, other suitable methods, or combinations thereof.

The S/D epitaxial features 122 may include epitaxially grown semiconductor material(s) such as epitaxially grown silicon or silicon carbon configured to form n-type FinFETs, and may additionally include one or more n-type dopants, such as phosphorus or arsenic. The p-type S/D epitaxial features 124 may include epitaxially grown semiconductor material(s) such as epitaxially grown silicon germanium configured to form p-type FinFETs, and may additionally include one or more p-type dopants, such as boron or indium. The S/D epitaxial features 122 and 124 may be formed by a low-pressure CVD (LPCVD) process with a silicon-based precursor, a selective epitaxial growth (SEG) process, a cyclic deposition and etching (CDE) process, or other epitaxial growth processes. In some embodiments, the dielectric fins 114 and/or 116 are tall enough (e.g., having a height similar to or greater than a height of each semiconductor fin 110 and/or hybrid fin 112) to prevent nearby S/D epitaxial features 122 and 124 from accidentally merging with, thus shorting, each other.

Although not intended to be limiting, one or more embodiments of the present disclosure provide many benefits to a semiconductor device. For example, embodiments of the present disclosure provide SRAM cells having dielectric fins inserted between two adjacent p-conductivity type semiconductor fins and between a p-conductivity type semiconductor fin and an n-conductivity type semiconductor fin, but not between two adjacent hybrid fins each having an n-conductivity type semiconductor portion. Additionally, eliminating the dielectric fin between two adjacent hybrid fins allows the spacing between the two hybrid fins to be reduced, thereby reducing the cell pitch and improving the device density. Furthermore, in some embodiments, each hybrid fin includes a dielectric portion disposed adjacent the semiconductor portion along a fin-length direction, where the dielectric portion is configured to be an etch-stop feature for protecting an S/D epitaxial feature formed over the semiconductor portion of an adjacent hybrid fin.

In one aspect, the present disclosure is directed to an IC that includes an SRAM cell having a first p-type semiconductor fin, a first hybrid fin, a second hybrid fin, and a second p-type semiconductor fin disposed in this order along a first direction and oriented lengthwise along a second direction generally perpendicular to the first direction, where the first and the second hybrid fins each includes a dielectric portion and a semiconductor portion. The SRAM cell further includes a first dielectric fin disposed between the first p-type semiconductor fin and the first hybrid fin and a second dielectric fin disposed between the second hybrid fin and the second p-type semiconductor fin. In some embodiments, each of the first and the second dielectric fins is oriented lengthwise along the second direction and a pitch between the first and the second hybrid fins is greater than a pitch between the first hybrid fin and the first dielectric fin and a pitch between the second hybrid fin and the second dielectric fin. Still further, the SRAM cell includes gate structures oriented lengthwise along the first direction and spaced from each other along the second direction, where the gate structures engage one or more of the first and the second dielectric fins, the first and the second p-type semiconductor fins, and the first and the second hybrid fins.

In another aspect, the present disclosure is directed to an SRAM cell that includes a first p-type semiconductor fin, a first dielectric fin, a first hybrid fin, a second hybrid fin, a second dielectric fin, and a second p-type semiconductor fin disposed in this order along a first direction and oriented lengthwise along a second direction generally perpendicular to the first direction. In some embodiments, each of the first and the second hybrid fins has a first portion including an n-type semiconductor material and a second portion including a dielectric material. The SRAM cell further includes n-type S/D epitaxial features disposed over each of the first and the second p-type semiconductor fins, p-type S/D epitaxial features disposed over the first portion of each of the first and the second hybrid fins, and S/D contacts disposed over and physically contacting each of the p-type S/D epitaxial features and the second portion of each of the first and the second hybrid fins, where the S/D contacts are oriented lengthwise along the first direction.

In yet another aspect, the present disclosure is directed to an IC that includes an SRAM having a first p-type semiconductor fin, a first hybrid fin, a second hybrid fin, and a second p-type semiconductor fin disposed in this order along a first direction and oriented lengthwise along a second direction generally perpendicular to the first direction and a first dielectric fin disposed between the first p-type semiconductor fin and the first hybrid fin, a second dielectric fin disposed between the second hybrid fin and the second p-type semiconductor fin. In some embodiments, each of the first and the second dielectric fins is oriented lengthwise along the second direction and a pitch between the first and the second hybrid fins is greater than a pitch between the first hybrid fin and the first dielectric fin and a pitch between the second hybrid fin and the second dielectric fin. In some embodiments, the first and the second hybrid fins each includes a dielectric portion and a semiconductor portion disposed adjacent the dielectric portion along the second direction. The SRAM cell further includes a first and a second gate structures oriented lengthwise along the first direction and spaced from each other along the second direction, where the first gate structure engages the first p-type semiconductor fin, the semiconductor portion of the second hybrid fin, and the second p-type semiconductor fin to form a first pass-gate (PG) field effect transistor (FET), a first pull-up (PU) FET, and a first pull-down (PD) FET, respectively, and where the second gate structure engages the first p-type semiconductor fin, the semiconductor portion of the first hybrid fin, and the second p-type semiconductor fin to form a second PD FET, a second PU FET, and a second PG FET, respectively.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:
a first static random-access memory (SRAM) cell including a first p-type semiconductor fin, a first hybrid fin, a second hybrid fin, and a second p-type semiconductor fin disposed in this order along a first direction and oriented lengthwise along a second direction generally perpendicular to the first direction, wherein the first and the second hybrid fins each includes a dielectric portion and a semiconductor portion;
a first dielectric fin disposed between the first p-type semiconductor fin and the first hybrid fin;
a second dielectric fin disposed between the second hybrid fin and the second p-type semiconductor fin,
wherein each of the first and the second dielectric fins is oriented lengthwise along the second direction, and wherein a pitch between the first and the second hybrid fins is greater than a pitch between the first hybrid fin and the first dielectric fin and a pitch between the second hybrid fin and the second dielectric fin; and
gate structures oriented lengthwise along the first direction and spaced from each other along the second direction, wherein the gate structures engage one or more of the first and the second dielectric fins, the first and the second p-type semiconductor fins, and the first and the second hybrid fins.

2. The IC of claim 1, further comprising:
a second SRAM cell disposed next to the first SRAM cell along the second direction, wherein layout of the second SRAM cell is a mirror image of layout of the first SRAM cell with respect to a first imaginary boundary line in the first direction;
a third SRAM cell disposed next to the second SRAM cell along the first direction, wherein layout of the third SRAM cell is a mirror image of the layout of the second SRAM cell with respect to a second imaginary boundary line going through the second dielectric fin lengthwise; and
a fourth SRAM cell disposed next to the third SRAM cell along the second direction and next to the first SRAM cell along the first direction, wherein layout of the fourth SRAM cell is a mirror image of the layout of the first SRAM cell with respect to the second imaginary boundary line.

3. The IC of claim 1, further comprising a third dielectric fin and a fourth dielectric fin, wherein the first p-type semiconductor fin is disposed between the third and the first dielectric fins, wherein the second p-type semiconductor fin is disposed between the second and the fourth dielectric fins, and wherein the third and the fourth dielectric fins define boundaries of the first SRAM cell.

4. The IC of claim 1, further comprising a butted contact (BCT) electrically contacting the first hybrid fin and one of the gate structures disposed over the first hybrid fin.

5. The IC of claim 1, the gate structures including a first and a second gate structures,
wherein the first gate structure engages the first p-type semiconductor fin, the semiconductor portion of the second hybrid fin, and the second p-type semiconductor fin to form a first pass-gate (PG) field effect transistor (FET), a first pull-up (PU) FET, and a first pull-down (PD) FET, respectively, and
wherein the second gate structure engages the first p-type semiconductor fin, the semiconductor portion of the first hybrid fin, and the second p-type semiconductor fin to form a second PD FET, a second PU FET, and a second PG FET, respectively.

6. The IC of claim 1, wherein a space between the first and the second hybrid fins is free of any dielectric fins.

7. The IC of claim 1, wherein the dielectric portion of each of the first and the second hybrid fins is disposed between two adjacent gate structures.

8. An integrated circuit (IC), comprising:
a static random-access memory (SRAM) cell including a first p-type semiconductor fin, a first dielectric fin, a first hybrid fin, a second hybrid fin, a second dielectric fin, and a second p-type semiconductor fin disposed in this order along a first direction and oriented lengthwise along a second direction generally perpendicular to the first direction, wherein each of the first and the second hybrid fins has a first portion including an n-type semiconductor material and a second portion including a dielectric material, wherein the first dielectric fin and the first hybrid fin are separated by a first spacing and the first hybrid fin and the second hybrid fin are separated by a second spacing, and wherein the first spacing is less than the second spacing.

9. The IC of claim 8, wherein the SRAM cell further includes:
a first and a second gate structures oriented lengthwise along the first direction;

a first butted contact (BCT) coupling a portion of the first gate structure with the first hybrid fin; and
a second BCT coupling a portion of the second gate structure with the second hybrid fin.

10. The IC of claim 9, wherein each of the first and the second BCTs is disposed over a junction between the first portion and the second portion of each of the first and the second hybrid fins, respectively.

11. The IC of claim 8, wherein the SRAM cell further includes:
a p-type source/drain (S/D) epitaxial feature disposed over the first portion of each of the first and the second hybrid fins;
an n-type S/D epitaxial feature disposed over each of the first and the second p-type semiconductor fins; and
a first S/D contact disposed over and physically contacting the p-type S/D epitaxial feature disposed over the first portion of the first hybrid fin and the second portion of the second hybrid fin, wherein the first S/D contact is oriented lengthwise along the first direction.

12. The IC of claim 11, wherein the SRAM cell further includes a second S/D contact disposed over and physically contacting the n-type S/D epitaxial feature disposed over the first p-type semiconductor fin, the first dielectric fin, and the p-type S/D epitaxial feature disposed over the first portion of the first hybrid fin; and a third S/D contact disposed over and physically contacting the n-type S/D epitaxial feature disposed over the second p-type semiconductor fin, the second dielectric fin, and the p-type S/D epitaxial feature disposed over the first portion of the second hybrid fin.

13. The IC of claim 11, wherein the first S/D contact is separated from the first and the second dielectric fins.

14. The IC of claim 8, wherein the first p-type semiconductor fin is separated from the first hybrid fin by a third spacing, and the second p-type semiconductor fin is separated from the second hybrid fin by a fourth spacing, wherein the third spacing is substantially the same as the fourth spacing.

15. The IC of claim 8, wherein the first spacing is less than the second spacing by about 25%.

16. The IC of claim 8, wherein the first and the second hybrid fins are adjacent to each other.

17. An integrated circuit (IC), comprising:
a static random-access memory (SRAM) cell including a first p-type semiconductor fin, a first hybrid fin, a second hybrid fin, and a second p-type semiconductor fin disposed in this order along a first direction and oriented lengthwise along a second direction generally perpendicular to the first direction;
a first dielectric fin disposed between the first p-type semiconductor fin and the first hybrid fin;
a second dielectric fin disposed between the second hybrid fin and the second p-type semiconductor fin,
wherein each of the first and the second dielectric fins is oriented lengthwise along the second direction, and wherein a pitch between the first and the second hybrid fins is greater than a pitch between the first hybrid fin and the first dielectric fin and a pitch between the second hybrid fin and the second dielectric fin; and
a first and a second gate structures oriented lengthwise along the first direction and spaced from each other along the second direction,
wherein the first and the second hybrid fins each includes a dielectric portion and a semiconductor portion disposed adjacent the dielectric portion along the second direction, wherein the first gate structure engages the first p-type semiconductor fin, the semiconductor portion of the second hybrid fin, and the second p-type semiconductor fin to form a first pass-gate (PG) field effect transistor (FET), a first pull-up (PU) FET, and a first pull-down (PD) FET, respectively, and wherein the second gate structure engages the first p-type semiconductor fin, the semiconductor portion of the first hybrid fin, and the second p-type semiconductor fin to form a second PD FET, a second PU FET, and a second PG FET, respectively.

18. The IC of claim 17, further comprising a butted contact (BCT) disposed over a portion of each of the first and the second gate structures that engages with the first and the second hybrid fins, respectively.

19. The IC of claim 18, wherein the pitch between the first and the second hybrid fins is about 1.5 times the pitch between the first hybrid fin and the first dielectric fin and the pitch between the second hybrid fin and the second dielectric fin.

20. The IC of claim 17, wherein a space disposed between the first and the second hybrid fins is free of any dielectric fins.

\* \* \* \* \*